United States Patent [19]

Sasaki et al.

[11] Patent Number: 5,837,422
[45] Date of Patent: Nov. 17, 1998

[54] PHOTOPOLYMERIZABLE COMPOSITION AND PHOTOSENSITIVE LITHOGRAPHIC PRINTING PLATE EMPLOYING IT

[75] Inventors: Mitsuru Sasaki; Fumiyuki Matsuo; Toshiaki Yokoo, all of Yokohama, Japan

[73] Assignee: Mitsubishi Chemical Corporation, Tokyo, Japan

[21] Appl. No.: 678,779

[22] Filed: Jul. 11, 1996

[30] Foreign Application Priority Data

Jul. 25, 1995 [JP] Japan .................................. 7-189095

[51] Int. Cl.⁶ ........................... G03F 7/029; G03F 7/028; G03F 7/031
[52] U.S. Cl. ........................... 430/284.1; 522/96
[58] Field of Search ............... 430/284.1; 522/96

[56] References Cited

U.S. PATENT DOCUMENTS

| | | | |
|---|---|---|---|
| 3,844,790 | 10/1974 | Chang et al. | 430/920 X |
| 4,458,007 | 7/1984 | Geissler et al. | 430/284.1 |
| 4,548,891 | 10/1985 | Riediker et al. | 430/284.1 X |
| 4,857,654 | 8/1989 | Riediker et al. | 522/96 |
| 5,236,968 | 8/1993 | Hirschmann | 522/96 X |
| 5,336,716 | 8/1994 | Kappes et al. | 525/23 |

FOREIGN PATENT DOCUMENTS

| | | |
|---|---|---|
| 0168226 | 1/1986 | European Pat. Off. .......... 522/96 |
| 0 530 613 | 3/1993 | European Pat. Off. . |
| 0 608 579 | 8/1994 | European Pat. Off. . |
| 0 614 122 | 9/1994 | European Pat. Off. . |
| 0 638 547 | 2/1995 | European Pat. Off. . |
| 61-145214A | 7/1986 | Japan .......... 522/96 |

OTHER PUBLICATIONS

15206–55–0, Registry, Copyright 1997 ACS.

*Primary Examiner*—Cynthia Hamilton
*Attorney, Agent, or Firm*—Oblon, Spivak, McClelland, Maier & Neustadt, P.C.

[57] ABSTRACT

A photopolymerizable composition comprising addition-polymerizable ethylenically unsaturated double bond-containing compounds and a photopolymerization initiator system, wherein, as the addition-polymerizable ethylenically unsaturated double bond-containing compounds, a compound (A) having at least 2 urethane bonds and at least 6 ethylenically unsaturated double bonds, and a compound (B) having no urethane bond and at least 3 ethylenically unsaturated double bonds, are contained in a weight ratio of from 4:1 to 1:4.

12 Claims, No Drawings

PHOTOPOLYMERIZABLE COMPOSITION AND PHOTOSENSITIVE LITHOGRAPHIC PRINTING PLATE EMPLOYING IT

The present invention relates to a photopolymerizable composition which is useful for a photosensitive lithographic printing plate or a photoresist, etc. More particularly, it relates to a photopolymerizable composition which is highly sensitive to light rays in a visible region and which is excellent in developability.

Heretofore, many photopolymerizable compositions have been known which contain addition polymerizable compounds having urethane bonds. For example, Japanese Unexamined Patent Publications No. 153624/1979 and No. 202740/1988 disclose addition polymerizable compounds such as urethane compounds having one addition polymerizable group at their terminals. However, an attention has been drawn primarily to their performance as resist materials to be used for a chemical or electrical method such as etching or plating, taking into the adhesion to copper or the flexibility, acid resistance, etc. into consideration, and further improvement has been desired with respect to the sensitivity of the photopolymerizable compositions.

Further, in recent years, various applications have been studied for highly sensitive photosensitive materials employing photopolymerizable photosensitive materials. Among them, a lithographic printing plate prepared by direct plate making by laser, may be mentioned as a system which is expected to be practically employed in near future. Accordingly, a photopolymerizable composition highly sensitive to light rays in a visible region of 488 nm or 532 nm, is desired. For such an application, the composition is required to be not only highly sensitive but also excellent in other properties such as developability. In addition to the above, with respect to photopolymerizable compositions containing addition polymerizable compounds having urethane bonds, Japanese Unexamined Patent Publication No. 13912/1972 discloses urethane compounds having from 1 to 3 unsaturated bonds at their terminals, Japanese Unexamined Patent Publication No. 14491/1979 discloses a reaction product of a polyester polyol with a monoisocyanate, Japanese Unexamined Patent Publication No. 128716/1982 discloses a reaction product of glycerol (meth)acrylate with an isocyanate compound, Japanese Unexamined Patent Publication No. 113430/1984 discloses a quaternary amino group-containing polymerizable urethane compound, and Japanese Unexamined Patent Publication No. 105238/1989 discloses a polymerizable urethane compound having a photooxidizable group in the presence of a photo-reducible dye. However, further improvements are desired with respect to both sensitivity and developability.

It is an object of the present invention to provide a photopolymerizable composition which is highly sensitive to light rays in a visible region and excellent also in developability, particularly a photopolymerizable composition excellent in properties such as sensitivity, developability, inking property and printing resistance, particularly when applied to a lithographic printing plate to be prepared by direct plate making by laser.

The present inventors have conducted extensive studies to accomplish the above object and as a result, have found it possible to satisfy both properties of high sensitivity and developability by using a specific compound having urethane bonds and a specific compound having no urethane bond in combination as addition polymerizable compounds, as a component of the photopolymerizable composition. The present invention has been accomplished on the basis of this discovery.

Thus, the present invention provides a photopolymerizable composition comprising addition-polymerizable ethylenically unsaturated double bond-containing compounds and a photopolymerization initiator system, wherein, as the addition-polymerizable ethylenically unsaturated double bond-containing compounds, a compound (A) having at least 2 urethane bonds and at least 6 ethylenically unsaturated double bonds, and a compound (B) having no urethane bond and at least 3 ethylenically unsaturated double bonds, are contained in a weight ratio of from 4:1 to 1:4.

The present invention also provides a photosensitive lithographic printing plate comprising a support and at least the above photopolymerizable composition coated thereon.

Now, the present invention will be described in detail with reference to the preferred embodiments The addition polymerizable ethylenically unsaturated double bond-containing compounds (hereinafter referred to simply as "ethylenic compounds") contained as the first essential component in the photopolymerizable composition of the present invention, are compounds having ethylenically unsaturated double bonds, which undergo addition polymerization and cure by an action of a photopolymerization initiator system as the second essential component, when the photopolymerizable composition is subjected to irradiation of active light rays, and they may, for example, be monomers having such double bonds or polymers having ethylenically unsaturated double bonds (hereinafter referred to simply as "ethylenic double bonds") on their side chains or main chains. In the present invention, the term "monomers" is used in the concept against so-called "high molecular substances", and accordingly includes dimers, trimers and oligomers in addition to monomers in a narrow sense.

As such ethylenic compounds, various known compounds may be mentioned, and specifically, those disclosed in Japanese Unexamined Patent Publication No. 35198/1994 may, for example, be mentioned.

The present invention is characterized in that among such ethylenic compounds, the above compound (A) and the above compound (B) are contained in a weight ratio of from 4:1 to 1:4.

In the present invention, the compound (A) having at least 2 urethane bonds and at least 6 unsaturated double bonds, is a compound having at least 2 urethane bonds of the formula:

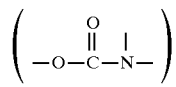

and at least 6 unsaturated double bonds, and can be prepared, for example, by a method of reacting an organic polyisocyanate compound with a hydroxy compound having an unsaturated double bond.

Here, as the organic polyisocyanate compound, various organic polyisocyanate compounds commonly known as starting materials for polyurethanes, may be used, including aromatic diisocyanates, alicyclic diisocyanates, aliphatic diisocyanate compounds and their derivatives such as trimers. Preferably, diphenylmethane diisocyanate, tolylene diisocyanate, xylene diisocyanate, hexamethylene diisocyanate, trimethylhexamethylene diisocyanate, isophorone diisocyanate, cyclohexane diisocyanate and isocyanurate compounds as their trimers, may, for example, be mentioned.

The hydroxy compound having an unsaturated double bond may, for example, be a compound having an unsaturated bond-containing group such as an acryloyl group or a methacryloyl group and having also a hydroxyl group, preferably a compound having a plurality of acryloyl groups or methacryloyl groups and having one hydroxyl group. Specifically, a reaction product of glycidyl (meth)acrylate with (meth)acrylic acid, pentaerythritol tri(meth)acrylate or dipentaerythritol penta(meth)acrylate may, for example, be mentioned.

A preferred example of the compound (A) having at least 2 urethane bonds and at least 6 unsaturated double bonds, is a compound of the following formula (I) or (II):

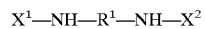

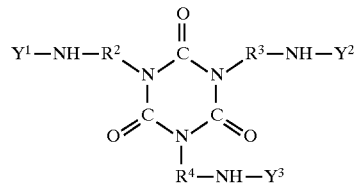

wherein each of $X^1$ and $X^2$ is —COOCH$_2$C(CH$_2$O—A)$_3$ or —COOCH$_2$C(CH$_2$O—A)$_2$CH$_2$OCH$_2$C(CH$_2$O—A)$_3$, each of $Y^1$, $Y^2$ and $Y^3$ is —COOCH$_2$C(CH$_2$O—A)$_3$, —COOCH$_2$C(CH$_2$O—A)$_2$CH$_2$OCH$_2$C (CH$_2$O—A)$_3$ or —COOCH(CH$_2$O—A)$_2$, A is an acryloyl group or a methacryloyl group, each of $R^1$ to $R^4$ is an alkylene group which may be branched, or —(CH$_2$)$_m$—Z—(CH$_2$)$_n$—, Z is a cyclohexylene group which may be substituted by a lower alkyl group, a phenylene group which may be substituted by a lower alkyl group, or —Ph—CH$_2$—Ph—, Ph is a phenylene group, and each of m and n is 0 or 1.

In the formulas (I) and (II), the alkylene group which may be branched, for each of $R^1$ to $R^4$, may, for example, be a hexamethylene group, a trimethylhexamethylene group or an octamethylene group, preferably the one having from 4 to 12 carbon atoms. In the case of a branched alkylene group, the carbon number of the branched chain is at a level of from 1 to 4. The carbon number of the lower alkyl as a substituent on the cyclohexylene group or the phenylene group for Z, is at a level of from 1 to 4. As a specific example of —(CH$_2$)$_m$—Z—(CH$_2$)$_n$— for each of $R^1$ to $R^4$, m-phenylene or m-xylylene may be mentioned. Each of $R^1$ to $R^4$ is preferably $C_{4-9}$, more preferably $C_{6-9}$ linear alkylene, and from the viewpoint of synthesis, $R^2$ to $R^4$ are usually preferably the same. Each of $X^1$ and $X^2$ is —COOCH$_2$C(CH$_2$O—A)$_3$ or —COOCH$_2$C(CH$_2$O—A)$_2$CH$_2$OCH$_2$C(CH$_2$O—A)$_2$, and $X^1$ and $X^2$ may be the same or different. Further, a plurality of A in each of $X^1$ and $X^2$ may be the same or different. However, from the viewpoint of synthesis, $X^1$ and $X^2$ as well as the plurality of A, are usually preferably the same groups. $Y^1$, $Y^2$ and $Y^3$ may be the same or different, and each represents $S^1$ or —COOCH(CH$_2$OA)$_2$. From the viewpoint of synthesis, they are preferably the same. Particularly preferred is —COOCH(CH$_2$O—A)$_2$.

As a preparation example of such a compound, 1 mol of an organic diisocyanate may be reacted with 2 mol of a compound having 3 (meth)acryloyl groups and 1 hydroxyl group, such as pentaerythritol tri(meth)acrylate, to obtain a compound having 2 urethane bonds and 6 (meth)acryloyl groups, for example, in accordance with the following formula:

$$R^1(NCO)_2 + 2(A-OCH_2)_3CCH_2OH \rightarrow \quad (I)$$

wherein $R^1$ and A are as defined above.

The compound (B) having no urethane bond and at least 3 ethylenic double bonds, to be used in the present invention, may, for example, be a compound having no urethane bond and at least 3 ethylenic double bonds, such as acryloyl groups or methacryloyl groups. Conventional compounds may be employed. Specifically, trimethylolpropane tri(meth)acrylate, trimethylolethane tri(meth)acrylate, pentaerythritol tri(meth)acrylate, pentaerythritol tetra(meth)acrylate, dipentaerythritol tri(meth)acrylate, dipentaerythritol tetra(meth)acrylate, dipentaerythritol penta(meth)acrylate, dipentaerythritol hexa(meth)acrylate, glycerol tri(meth)acrylate, or pyrogallol triacrylate, may, for example, be mentioned. Particularly preferred among them is trimethylolpropane tri(meth)acrylate, pentaerythritol tetra(meth)acrylate or dipentaerythritol hexa(meth)acrylate.

The above compound (A) and the compound (B) are used in a weight ratio of (A):(B) being within a range of from 4:1 to 1:4, preferably from 3:1 to 1:3. If the amount of compound (A) is larger than this range, deterioration in the developability tends to be observed, and if it is smaller than this range, the sensitivity tends to be low, such being undesirable.

Further, the content of compound (A) is preferably within a range of from 10 to 80 wt %, more preferably from 20 to 60 wt %, in all ethylenic compounds. If compound (A) is larger than this range, deterioration of the developability tends to be observed, and if it is smaller than this range, the sensitivity tends to be low.

In the present invention, the compound (C) having no urethane bond and 2 ethylenic double bonds to be used as the case requires, is preferably an ester compound obtained by reacting two (meth)acrylic acids to a diol compound, more preferably an ester compound obtained by reacting a bisphenol compound or its derivative, with two (meth)acrylic acids. More specifically, a compound of the following formula (III) is preferred:

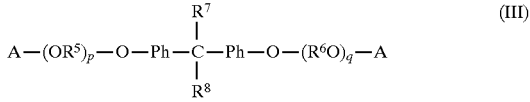

wherein A is an acryloyl group or a methacryloyl group, each of $R^5$ and $R^6$ is an alkylene group which may be branched, each of $R^7$ and $R^8$ is a hydrogen atom, an alkyl group which may be substituted, a cycloalkyl group which may be substituted or a phenyl group which may be substituted, Ph is a phenylene group, and p and q are positive integers satisfying p+q=2 to 30.

More preferred is the one wherein p+q =2 to 4. Specific examples include 2,2-bis[4-(acryloxydiethoxy)phenyl] propane (A-BPE-4, tradename, manufactured by Shin Nakamura Kagaku Kogyo K. K.), 2,2-bis[4—(methacryloxyethoxy)phenyl]propane (BPE-100, tradename, manufactured by Shin Nakamura Kagaku Kogyo K. K.), and 2,2-bis[4—(methacryloxydiethoxy)phenyl] propane (BPE-200, tradename, manufactured by Shin Nakamura Kagaku Kogyo K. K.).

When compound (C) is used, its content is preferably within a range of from 10 to 70 wt %, more preferably from 30 to 60 wt %, in all addition polymerizable compounds. If the content exceeds this range, the sensitivity tends to be low, such being undesirable.

When compound (C) is incorporated, the sensitivity and the developability are good and well balanced, such being particularly preferred.

In the present invention, to modify the properties of the photopolymerizable composition, other ethylenic compounds may be incorporated to such an extent not to impair the performance. Such ethylenic compounds may, for example, be an unsaturated carboxylic acid, an ester of an aliphatic polyhydroxy compound with an unsaturated carboxylic acid, an ester of an aromatic polyhydroxy compound with an unsaturated carboxylic acid, and an ester obtained by an esterification reaction of an unsaturated carboxylic acid, a polybasic carboxylic acid and a polyvalent hydroxy compound such as an aliphatic polyhydroxy compound or an aromatic polyhydroxy compound (provided that the above compounds (A) and (B) are excluded).

The ester of the aliphatic polyhydroxy compound with an unsaturated carboxylic acid is not particularly limited and may, for example, be an acrylic acid ester such as ethylene glycol monoacrylate, triethylene glycol monoacrylate, trimethylolpropane monoacrylate, trimethylolethane monoacrylate, pentaerythritol monoacrylate, dipentaerythritol monoacrylate or glycerol monoacrylate, a methacrylic acid ester having "acrylate" in these illustrated compounds substituted by "methacrylate", an itaconic acid ester likewise substituted by "itaconate", a crotonic acid ester likewise substituted by "crotonate", or a maleic acid ester likewise substituted by "maleate".

The ester of an aromatic polyhydroxy compound with an unsaturated carboxylic acid, may, for example, be hydroquinone monoacrylate, hydroquinone monomethacrylate, resorcinol monoacrylate, resorcinol monomethacrylate or pyrogallol monoacrylate.

The ester obtained by an esterification reaction of an unsaturated carboxylic acid with a polyvalent hydroxy compound may not necessarily be a single substance. Typical examples include a condensation product of acrylic acid, phthalic acid and ethylene glycol, a condensation product of acrylic acid, maleic acid and diethylene glycol, a condensation product of methacrylic acid, terephthalic acid and pentaerythritol, and a condensation product of acrylic acid, adipic acid, butanediol and glycerol.

The content of such additional ethylenic compounds is preferably at most 50 wt %, more preferably at most 20 wt %, in all ethylenic compounds.

Now, the photopolymerization initiator system as the second essential component of the photopolymerizable composition of the present invention, will be described.

As such a photopolymerization initiator system, any initiator system may be employed so long as it is capable of initiating polymerization of the addition-polymerizable compounds. As an active agent which forms active radicals by some action with a sensitizer excited by light, a hexaarylbiimidazole, a titanocene compound, a halogenated hydrocarbon derivative, a diaryliodonium salt, or an organic peroxide may, for example, be mentioned. Among them, a system employing a hexaarylbiimidazole or a titanocene compound, is preferred, since the sensitivity, storage stability, adhesion of the coating film to the substrate, etc. are thereby good.

As the hexaarylbiimidazole, various types may be employed, including, for example, 2,2'-bis(o-chlorophenyl)-4,4',5,5'-tetra(p-carboethoxyphenyl)biimidazole, 2,2'-bis(o-chlorophenyl)-4,4',5,5'-tetra(p-carbomethoxyphenyl)biimidazole, 2,2'-bis(o-chlorophenyl)-4,4',5,5'-tetra(p-carbofluorophenyl)biimidazole, 2,2'-bis(o-bromophenyl)-4,4',5,5'-tetra(p-iodophenyl)biimidazole, 2,2'-bis(o-chlorophenyl)-4,4',5,5'-tetra(p-chloronaphthyl)biimidazole, 2,2'-bis(o-chlorophenyl)-4,4',5,5'-tetra(p-chlorophenyl)biimidazole, 2,2'-bis(o-bromophenyl)-4,4',5,5'-tetra(p-chloro-p-methoxyphenyl)biimidazole, 2,2'-bis(o-chlorophenyl)-4,4',5,5'-tetra(o,p-dichlorophenyl)biimidazole, 2,2'-bis(o-chlorophenyl)-4,4',5,5'-tetra(o,p-dibromophenyl)biimidazole, 2,2'-bis(o-bromophenyl)-4,4',5,5'-tetra(o,p-dichlorophenyl)biimidazole, and 2,2'-bis(o,p-dichlorophenyl)-4,4',5,5'-tetra(o,p-dichlorophenyl)biimidazole.

These biimidazoles may be used with other biimidazoles, as the case requires. Biimidazoles can easily be prepared, for example, by the methods disclosed in Bull. Chem. Soc. Japan, 33, 565 (1960) and J. Org. Chem, 36[16]2262 (1971).

As the titanocene compound, various types may be employed. For example, it may be suitably selected for use among various titanocene compounds disclosed in Japanese Unexamined Patent Publications No. 152396/1984 and No. 151197/1986. More specifically, it may, for example, be dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicylcopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-l-yl, dimethylcyclopentadienyl-Ti-bis-2,3,4,5,6-pentafluorophen-1-yl, dimethylcyclopentadienyl-Ti-bis-2,6-difluorophen-1-yl, or dicyclopentadienyl-Ti-bis-2,6-difluoro-3—(pyr-1-yl)-phen-1-yl.

Now, the sensitizer will be described. The sensitizer in the present invention is preferably a compound which is capable of effectively generating active radicals under irradiation with visible light rays when it is coexistent with the above described active agent.

Typical examples of such a sensitizer include a triphenylmethane-type leuco dye such as leuco crystal violet or leuco malachite green, and a photo-reducible dye such as erythrocin or eosine Y, as disclosed in e.g. U.S. Pat. No. 3,479,185, an aminophenylketone such as Michler's ketone or aminostyrylketone as disclosed in e.g. U.S. Pat. Nos. 3,549,367 and 3,652,275, β-diketones as disclosed in U.S. Pat. No. 3,844,790, indanones as disclosed in U.S. Pat. No. 4,162,162, ketocumarins as disclosed in Japanese Unexamined Patent Publication No. 112681/1977, aminostyrene derivatives and aminophenylbutadiene derivatives as disclosed in Japanese Unexamined Patent Publication No. 56403/1984, aminophenyl heterocyclic compounds as disclosed in U.S. Pat. No. 4,594,310, julolidine heterocyclic compounds as disclosed in U.S. Pat. No. 4,966,830, and pyromethene type dyes as disclosed in Japanese Unexamined Patent Publication No. 241338/1993.

Now, a polymer binder which is preferably incorporated to the photopolymerizable composition of the present invention, will be described. This is a component which imparts a skin-forming ability or a viscosity-regulating ability. It may, for example, be a homopolymer or copolymer of (meth)acrylic acid, an ester thereof, maleic acid, acrylonitrile, styrene, vinyl acetate or vinylidene chloride, or polyethylene oxide, polyvinylpyrrolidone, polyamide, polyurethane, polyethylene terephthalate, acetylcellulose or polyvinyl butyral.

In the foregoing, the main constituting components for the photopolymerizable composition of the present invention have been described in detail. Their preferred proportions are such that relative to 100 parts by weight of the ethylenic compounds, in the photopolymerization initiator system, the sensitizer is preferably from 0.01 to 20 parts by weight, more preferably from 0.05 to 10 parts by weight, the active agent is preferably from 0.1 to 80 parts by weight, more preferably from 0.5 to 50 parts by weight, and the polymer binder is preferably from 10 to 400 parts by weight, more preferably from 20 to 200 parts by weight.

The photopolymerizable composition of the present invention may contain, in addition to the above-described constituting components, other materials depending upon the particular purpose. For example, a heat polymerization preventing agent such as hydroquinone, p-methoxyphenol or 2,6-di-t-butyl-p-cresol, a coloring agent composed of an organic or inorganic dye or pigment, a plasticizer such as dioctyl phthalate, didodecyl phthalate or tricresyl phosphate, a sensitivity-improving agent such as a tertiary amine or thiol, or other additives such as a colorant precursor, may be incorporated.

Preferred amounts of the above-mentioned various additives are such that relative to 100 parts by weight of the ethylenic compounds, the heat polymerization preventing agent is at most 2 parts by weight, the coloring agent is at most 20 parts by weight, the plasticizer is at most 40 parts by weight, and the colorant precursor is at most 30 parts by weight.

The above-described photopolymerizable composition will be coated, without any solvent or as diluted with a suitable solvent, on a support of e.g. plastic, paper or metal, followed by drying to form a photosensitive layer. It is particularly advantageous to use the photopolymerizable composition of the present invention for a photosensitive lithographic printing plate having a layer thereof formed on a support. To be used for a photosensitive lithographic printing plate, an aluminum support having grain treatment and then anodizing treatment applied, may suitably be employed. As the coating method, a conventional method such as dip coating, rod coating, spin coating, spray coating or roll coating, may be employed.

Further, an oxygen-shielding layer may be formed on the photosensitive layer to prevent the polymerization inhibition action by oxygen. Such a layer may, for example, be made of a water-soluble polymer such as polyvinyl alcohol, polyvinyl pyrrolidone, polyethylene oxide or cellulose. Among them, polyvinyl pyrrolidone, polyvinyl alcohol or a mixture thereof is particularly preferred.

The light source for exposure applicable to the composition of the present invention is not particularly limited. However, carbon arc, a high pressure mercury lamp, a xenon lamp, a metal halide lamp, a fluorescent lamp, a tungsten lamp, a halogen lamp, a helium cadmium laser, an argon ion layer, a YAG laser or a helium neon layer may, for example, be particularly suitably used.

The photopolymerizable composition of the present invention is capable of forming an image on the support, if image exposure is carried out with such a light source, followed by development by means of, for example, an aqueous solution containing a surfactant and an alkali. Such an aqueous solution may further contain an organic solvent, a buffering agent, a dye or a pigment. A suitable alkali agent may, for example, be an inorganic alkali agent such as sodium silicate, potassium silicate, sodium hydroxide, potassium hydroxide, lithium hydroxide, sodium tertiary phosphate, sodium secondary phosphate, sodium carbonate, potassium carbonate or sodium hydrogencarbonate, or an organic amine compound such as trimethylamine, diethylamine, monoisopropylamine, n-butylamine, monoethanolamine, diethanolamine or triethanolamine. These compounds may be used alone or in a proper combination. The surfactant may, for example, be a nonionic surfactant such as polyoxyethylenealkylethers, polyoxyethylenealkylallylethers, polyoxyethylenealkylesters, sorbitanalkylesters or monoglyceridealkylesters, an anionic surfactant such as alkylbenzene sulfonates, alkylnaphthalene sulfonates, alkyl sulfates, alkyl sulfonates or sulfosuccinates, or an amphoteric surfactant such as alkylbetaines or amines. Further, as the organic solvent, isopropyl alcohol, benzyl alcohol, ethyl cellosolve, butyl cellosolve, phenyl cellosolve, propylene glycol or diacetone alcohol, may, for example, be incorporated, as the case requires.

As the support in the present invention, metals, plastics or papers may be employed. Particularly preferred is an aluminum support. When an aluminum plate is used as the support, grain treatment, anodizing treatment and, if necessary, surface treatment such as pore sealing treatment, are applied. Conventional methods may be employed for these treatments.

As a grain treatment method, a mechanical method or an electrolytic etching method may, for example, be mentioned. The mechanical method may, for example, be a ball polishing method, a brush polishing method, a liquid horning polishing method, or a buff polishing method. Depending upon the composition of the aluminum material, the above-mentioned various methods may be used alone or in combination. Preferred is an electrolytic etching method.

The electrolytic etching is carried out in a bath containing one or more of inorganic acids such as phosphoric acid, sulfuric acid, hydrochloric acid and nitric acid. After the grain treatment, desmatte treatment is carried out by means of an aqueous alkaline or acidic solution for neutralization, as the case requires, followed by washing with water.

The anodizing treatment is carried out by electrolysis using an aluminum plate as an anode and a solution containing one or more acids such as sulfuric acid, chromic acid, oxalic acid, phosphoric acid and malonic acid, as an electrolyte. The amount of the formed anodized film is suitably from 1 to 50 $mg/dm^2$, preferably from 10 to 40 $mg/dm^2$. The amount of the anodized film may be determined by immersing the aluminum plate in a chromium phosphate solution (prepared by dissolving 35 ml of 85% phosphoric acid solution and 20 g of chromium (VI) oxide in 1 l of water) to dissolve the anodized film, whereupon the amount is obtained by measuring the weight change as between before and after dissolving the anodized film of the plate.

The pore-sealing treatment may, for example, be boiling water treatment, steam treatment, sodium silicate treatment or treatment with an aqueous dichromate solution. Further, primer treatment with an aqueous solution of a metal salt such as zirconic fluoride or a water-soluble polymer compound, may be applied to the aluminum plate support. Now, the present invention will be described in further detail with reference to Examples and Comparative Examples. However, it should be understood that the present invention is by no means restricted by such specific Examples.

EXAMPLES 1 to 7 and COMPARATIVE EXAMPLES 1 to 6

An aluminum plate was degreased with 3% sodium hydroxide and then subjected to electrolytic etching treatment in a 11.5 g/l hydrochloric acid bath at 25° C. at a current density of 80 $A/dm^2$ for 11 seconds. Then, it was washed with water and then anodized in a 30% sulfuric acid bath at 30° C. at a current density of 11.5 $A/dm^2$ for 15 seconds. Then, it was subjected to hot water pore sealing treatment at 90° C. at a pH of 9, then washed with water and dried, to obtain an aluminum plate for a lithographic printing plate.

The following photopolymerizable composition coating liquid was coated on the aluminum plate by means of a whirler so that the dried film thickness would be 2 $g/m^2$ and dried. Further, an aqueous polyvinyl alcohol solution was coated thereon by means of a whirler so that the dried film thickness would be 3 $g/m^2$, and dried to obtain a photosensitive lithographic printing plate. The photosensitive lithographic printing plate was evaluated in accordance with the following evaluation methods. The results are shown in Table 1.

Evaluation Methods

The photosensitive lithographic printing plate was exposed by means of a diffraction spectral irradiation apparatus (RM-23, manufactured by Narumi K. K.) and then developed with a developing solution prepared by diluting a developer stock solution comprising 20 wt % of potassium hydroxide, 75 wt % of potassium silicate and 5 wt % of sodium alkylnaphthalene sulfonate (Perex NBL, tradename, manufactured by Kao Corporation), five times with water. From the height of the cured image thereby obtained, the light energy (solid sensitivity) required for the photocuring by light rays with a wavelength of 488 nm, was determined.

Further, one drop of methylcellosolve was dropped on a non-exposed portion of the plate after development and dried in air, whereupon inking was made with an image-forming ink PI-2 (manufactured by Fuji Photo Film Co., Ltd.), and staining of the non-exposed portion was visually evaluated. Symbol ○ indicates that the ink did not attach, symbol Δ indicates that the ink slightly attached along the fringe of the dropped methylcellosolve, and symbol X indicates that the ink attached distinctly.

Photopolymerizable composition coating liquid:

Ethylenic compounds identified in Table 1 Total of 50 parts

Photopolymerization initiator identified in Table 1 10 parts

Sensitizer identified in Table 1 3 parts

Polymer binder (copolymer of isobutyl methacrylate/isobutyl acrylate/methyl methacrylate/methacrylic acid=40/10/35/15 mol %, weight average molecular weight: 100,000) 50 parts 2-Mercaptobenzothiazole 5 parts Ethyl p-N,N-dimethylaminobenzoate 10 parts Methyl ethyl ketone 90 parts

TABLE 1

| | | | Evaluation results | | | | | | | |
|---|---|---|---|---|---|---|---|---|---|---|
| | | | Example 1 | Example 2 | Example 3 | Example 4 | Example 5 | Example 6 | Example 7 |
| Ethylenic compounds | Component A (parts) | M-1 | 12.5 | 20 | | | 25 | | |
| | | M-2 | | | 20 | | | 40 | |
| | | M-3 | | | | 5 | | | 10 |
| | Component B (parts) | Trimethylolpropane triacrylate | | | | 20 | | | 40 |
| | | Pentaerythritol tetraacrylate | 12.5 | 10 | | | 25 | | |
| | | Dipentaerythritol hexaacrylate | | | 5 | | | 10 | |
| | Component C (parts) | A-BPE-4 | 25 | 20 | | | | | |
| | | BPE-200 | | | 25 | 25 | | | |
| Contents in ethylenic compounds (wt %) | | Component (A) | 25 | 40 | 40 | 10 | 50 | 80 | 20 |
| | | Component (B) | 25 | 20 | 10 | 40 | 50 | 20 | 80 |
| | | Component (C) | 50 | 40 | 50 | 50 | 0 | 0 | 0 |
| | | A:B | 1:1 | 2:1 | 4:1 | 1:4 | 1:1 | 4:1 | 1:4 |
| Polymerization initiator | | | 1-2 | 1-2 | 1-2 | 1-2 | 1-1 | 1-2 | 1-1 |
| Sensitizer | | | Z-2 | Z-2 | Z-2 | Z-2 | Z-1 | Z-2 | Z-1 |
| Solid sensitivity ($\mu J/cm^2$) | | | 180 | 140 | 160 | 190 | 120 | 100 | 190 |
| Staining of non-exposed portion | | | ○ | ○ | ○ | ○ | Δ | Δ | Δ |

| | | | Comparative Example 1 | Comparative Example 2 | Comparative Example 3 | Comparative Example 4 |
|---|---|---|---|---|---|---|
| Ethylenic compounds | Component A (parts) | M-1 | | 2.5 | | |
| | | M-2 | | | | |
| | | M-3 | 37.5 | | 45 | 5 |
| | Component B (parts) | Trimethylolpropane triacrylate | | 10 | 5 | |
| | | Pentaerythritol tetraacrylate | | 2.5 | | |
| | | Dipentaerythritol hexaacrylate | 7.5 | | | 45 |
| | Component C (parts) | A-BPE-4 | 5 | | | |
| | | BPE-200 | | 35 | | |
| Contents in ethylenic compounds (wt %) | | Component (A) | 75 | 5 | 90 | 10 |
| | | Component (B) | 15 | 25 | 10 | 90 |
| | | Component (C) | 10 | 70 | 0 | 0 |
| | | A:B | 5:1 | 1:5 | 9:1 | 1:9 |
| Polymerization initiator | | | 1-2 | 1-2 | 1-1 | 1-1 |
| Sensitizer | | | Z-2 | Z-2 | Z-1 | Z-1 |
| Solid sensitivity ($\mu J/cm^2$) | | | 110 | 480 | Not measurable | 580 |
| Staining of non-exposed portion | | | X | ○ | X | Δ |

The symbols used in Table 1 represent the following compounds.

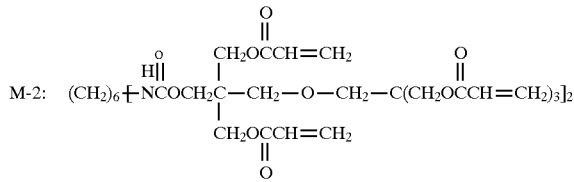

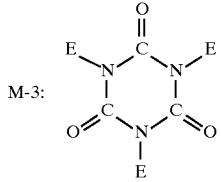

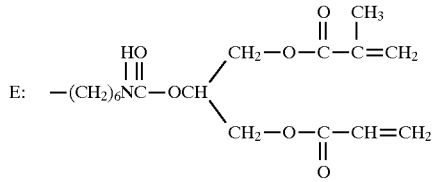

A-BPE-4 (manufactured by Shin Nakamura Kagaku Kogyo K.K.)

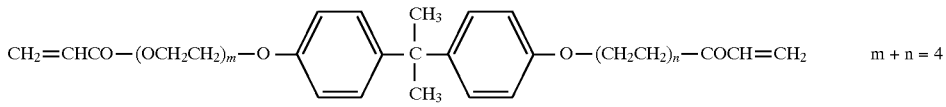

BPE-200 (manufactured by Shin Nakamura Kagaku Kogyo K.K.)

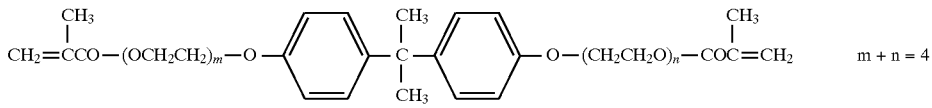

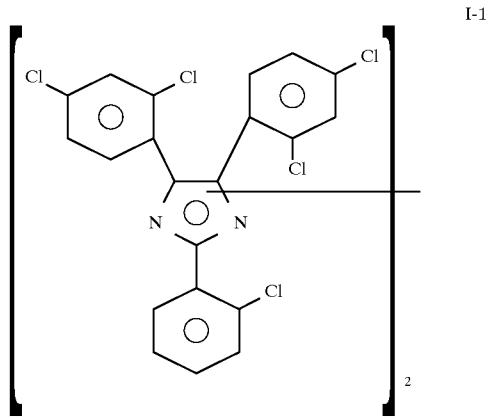

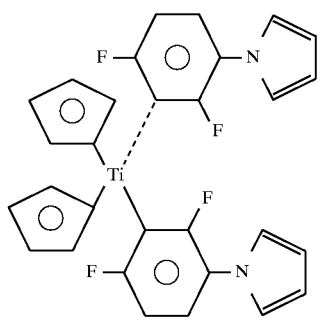

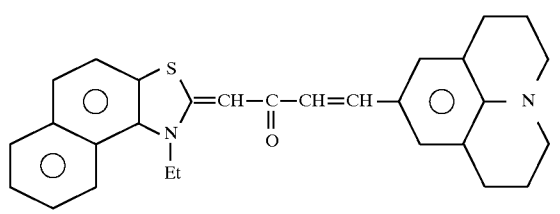

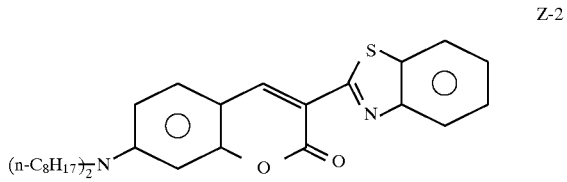

The photopolymerizable composition of the present invention is excellent in sensitivity and developability (little staining of the non-exposed portion).

What is claimed is:

1. A photosensitive lithographic printing plate having a photopolymerizable composition provided on a substrate, the photopolymerizable composition comprising addition-polymerizable ethylenically unsaturated double bond-containing compounds and a photopolymerization initiator system containing a hexaarylbiimidazole or titanocene compound, wherein as the addition-polymerizable ethylenically unsaturated double bond-containing compounds, a compound (A) having at least 2 urethane bonds and at least 6 ethylenically unsaturated double bonds, and a compound (B) having no urethane bond and at least 3 ethylenically unsaturated double bonds, are contained in a weight ratio of from 4:1 to 1:4.

2. The photosensitive lithographic printing plate according to claim 1, wherein the compound (A) having at least 2 urethane bonds and at least 6 ethylenically unsaturated double bonds, and the compound (B) having no urethane bond and at least 3 ethylenically unsaturated double bonds, are contained in a weight ratio of 3:1 to 1:3.

3. The photosensitive lithographic printing plate according to claim 1, wherein the compound (A) having at least 2 urethane bonds and at least 6 ethylenically unsaturated double bonds, is a compound obtained by reacting an organic polyisocyanate compound with a hydroxy compound having an ethylenically unsaturated double bond.

4. The photosensitive lithographic printing plate according to claim 1, wherein the compound (A) having at least 2 urethane bonds and at least 6 ethylenically unsaturated double bonds, is a compound of the following formula (I) or (II):

$$X^1\text{—NH—}R^1\text{—NH—}X^2 \quad (I)$$

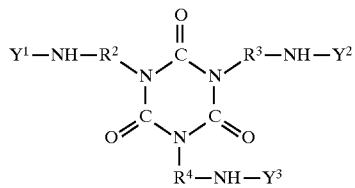

wherein each of $X^1$ and $X^2$ is $-COOCH_2C(CH_2O-A)_3$ or $-COOCH_2C(CH_2O-A)_2CH_2OCH_2C(CH_2O-A)_3$, each of $Y^1$, $Y^2$ and $Y^3$ is $-COOCH_2C(CH_3O-A)_3$, $-COOCH_2C(CH_2O-A)_2CH_2OCH_2C(CH_2O-A)_3$ or $-COOCH(CH_2O-A)_2$, A is an acryloyl group or a methacryloyl group, each of $R^1$ to $R^4$ is an alkylene group which is branched or is not branched or $-(CH_2)_m-Z-(CH_2)_n-$, Z is a cyclohexylene group which is unsubstituted or is substituted by a lower alkyl group, a phenylene group which is unsubstituted or is substituted by a lower alkyl group, or $-Ph-CH_2-Ph-$, Ph is a phenylene group, and each of m and n is 0 or 1.

5. The photosensitive lithographic printing plate according to claim 1, wherein the content of the compound (A) having at least 2 urethane bonds and at least 6 ethylenically unsaturated double bonds, is from 10 to 80 wt % in all addition-polymerizable ethylenically unsaturated double bond-containing compounds.

6. The photosensitive lithographic printing plate according to claim 5, wherein the content of the compound (A) having at least 2 urethane bonds and at least 6 ethylenically unsaturated double bonds, is from 20 to 60 wt % in all addition-polymerizable ethylenically unsaturated double bond-containing compounds.

7. The photosensitive lithographic printing plate according to claim 1, wherein the compound (B) having no urethane bond and at least 3 ethylenically unsaturated double bonds, is at least one member selected from the group consisting of trimethylolpropane triacrylate, trimethylolpropane trimethacrylate, pentaerythritol tetraacrylate, pentaerythritol tetramethacrylate, dipentaerythritol hexaacrylate and dipentaerythritol hexamethacrylate.

8. The photosensitive lithographic printing plate according to claim 1, wherein the photopolymerization initiator system contains a hexaarylbiimidazole compound.

9. The photosensitive lithographic printing plate according to claim 1, wherein the photopolymerization initiator system contains a titanocene compound.

10. A photosensitive lithographic printing plate comprising addition-polymerizable ethylenically unsaturated double bond-containing compounds and a photopolymerization initiator system, wherein, as the addition-polymerizable ethylenically unsaturated double bond-containing compounds, a compound (A) having at least 2 urethane bonds and at least 6 ethylenically unsaturated double bonds, a compound (B) having no urethane bond and at least 3 ethylenically unsaturated double bonds are contained in a weight ratio of from 4:1 to 1:4. and a compound (C) having no urethane bond and 2 ethylenically unsaturated double bonds, as an additional polymerizable ethylenically unsaturated double bond-containing compound, in an amount of from 10 to 70 wt % in all addition-polymerizable ethylenically unsaturated double bond-containing compounds, wherein the compound (C) having no urethane bond and 2 ethylenically unsaturated double bonds, is a compound of the following formula (III):

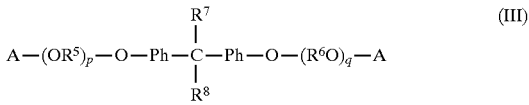

wherein A is an acryloyl group or a methacryloyl group, each of $R^5$ and $R^6$ is an alkylene group which is branched or is not branched, each of $R^7$ and $R^8$ is a hydrogen atom, an alkyl group which is unsubstituted or is substituted, a cycloalkyl group which is unsubstituted or is substituted, or a phenyl group which is unsubstituted or is substituted, Ph is a phenylene group, and p and q are positive integers satisfying p+q=2 to 30.

11. The photosensitive lithographic printing plate according to claim 8, wherein the content of the compound (C) having no urethane bond and 2 ethylenically unsaturated double bonds, is from 30 to 60 wt % in all addition-polymerizable ethylenically unsaturated double bond-containing compounds.

12. The photosensitive lithographic printing plate according to claim 10, wherein p and q in the formula (III) for the compound (C) having no urethane bond and 2 ethylenically unsaturated double bonds, are positive integers satisfying p+q =2 to 4.

* * * * *